(12) United States Patent
Asato et al.

(10) Patent No.: US 7,208,263 B2
(45) Date of Patent: Apr. 24, 2007

(54) METHOD FOR MANUFACTURING PHOTOSENSITIVE RESIN PRINTING PLATE, AND DEVELOPER TREATMENT DEVICE

(75) Inventors: Kumiko Asato, Kusatsu (JP); Shinji Tanaka, Okazaki (JP); Toshiki Kito, Anjo (JP); Katsuhiro Uehara, Setagaya-ku (JP)

(73) Assignee: Toray Industries, Inc. (JP)

( * ) Notice: Subject to any disclaimer, the term of this patent is extended or adjusted under 35 U.S.C. 154(b) by 47 days.

(21) Appl. No.: 10/482,512

(22) PCT Filed: Jul. 2, 2002

(86) PCT No.: PCT/JP02/06695

§ 371 (c)(1),
(2), (4) Date: Dec. 30, 2003

(87) PCT Pub. No.: WO03/005129

PCT Pub. Date: Jan. 16, 2003

(65) Prior Publication Data

US 2004/0182266 A1 Sep. 23, 2004

(30) Foreign Application Priority Data

Jul. 6, 2001 (JP) ............................. 2001-206508

(51) Int. Cl.
*G03F 7/00* (2006.01)
(52) U.S. Cl. ....................... 430/302; 430/309; 396/564; 396/604; 396/644
(58) Field of Classification Search ................ 430/302, 430/309; 396/564, 604, 644
See application file for complete search history.

(56) References Cited

U.S. PATENT DOCUMENTS 3,625,131 A * 12/1971 Puls ........................... 396/606

(Continued)

FOREIGN PATENT DOCUMENTS

EP 747773 A1 * 12/1996

(Continued)

OTHER PUBLICATIONS

English language abstract of JP 05-224403.*

(Continued)

*Primary Examiner*—Amanda Walke
(74) *Attorney, Agent, or Firm*—DLA Piper US LLP (57) ABSTRACT

A method for making a photosensitive resin printing plate which comprises at least (1) the exposure step of forming a latent image in an aqueous-developable photosensitive resin layer of a printing plate material by irradiating the printing plate material with a ray of active light, (2) the development step of forming a relief image from the latent image by dissolving or dispersing the photosensitive resin layer that forms the latent image into a developer that contains water as a main component, and (3) the drying step of removing the developer from the printing plate having the relief image, the method being characterized in that a photosensitive resin layer component-dissolved or dispersed developer produced in the development step is subjected to a reduced pressure distillation, and is therefore reused as a developer, and a residue produced by the reduced pressure distillation is solidified. Furthermore, a photosensitive resin printing plate material developer processing apparatus for processing a photosensitive resin layer component-containing developer characterized by comprising an evaporator that reduces a pressure of the developer, a cooler that recovers a developer by condensing a developer vapor, and a detachable inner container provided within the evaporator.

A developer produced as a result of the development of a photosensitive resin printing plate material and, more particularly, an aqueous-developable photosensitive resin printing plate material, can be reused without a reduction in the developing speed nor aggregation of a photosensitive resin layer component.

7 Claims, 3 Drawing Sheets

U.S. PATENT DOCUMENTS 5,128,234 A * 7/1992 Telser .................. 430/306
5,204,227 A * 4/1993 Larimer ................ 430/331
5,828,923 A * 10/1998 Harabin et al. ......... 396/626
6,989,226 B2 * 1/2006 Araki et al. ........... 430/287.1

FOREIGN PATENT DOCUMENTS

| EP | 1014200 A1 * | 6/2000 |
| JP | 4-59098 A | 2/1992 |
| JP | 05224403 A * | 9/1993 |
| JP | 06011843 A * | 1/1994 |
| JP | 2000-310862 A | 11/2000 |
| WO | 93/07539 A1 | 4/1993 |
| WO | WO 9844389 A1 * | 10/1998 |

OTHER PUBLICATIONS

English language abstract of JP 04-059098.*
English language translation of JP 06-011843.*

* cited by examiner

METHOD FOR MANUFACTURING PHOTOSENSITIVE RESIN PRINTING PLATE, AND DEVELOPER TREATMENT DEVICE

TECHNICAL FIELD

The present invention relates to a method for making a photosensitive resin printing plate and, more particularly, to a method for making photosensitive resin printing plate in which a developer is extracted for reuse from a photosensitive resin layer component-dissolved or dispersed developer produced during a development step, by removing a photosensitive resin layer component therefrom. More specifically, the invention relates to a method for making photosensitive resin printing plate material in which a developer is recovered from a developer mixture in which a photosensitive resin layer component-dissolved or dispersed developer produced during a development step is distilled under reduced pressure, and is therefore reused as a developer, so that the operation of developing photosensitive resin printing plate materials can be conducted stably for a long time without disposal of the developer.

BACKGROUND ART

The use of a photosensitive resin composition as a printing plate has been a common practice, and has become mainstream in various fields, such as letterpress printing, lithography printing, intaglio printing, etc.

A photosensitive resin printing plate is used as follows. That is, a negative or positive original image film is placed in close contact with the photosensitive layer of the printing plate, and a ray of active light is applied thereto through the original image film so as to form in the photosensitive layer a latent image made up of solvent-soluble portions and solvent-insoluble portions, or hardened portions and non-hardened portions. By developing the latent image, a relief image is formed, so that the plate can be used as a printing plate. Development methods employed for photosensitive resin printing plate materials include a method in which unexposed portions are blown off by using compressed air or the like, a method in which unexposed portions are removed by jetting a developer at a fixed pressure in a spray fashion, and a method in which unexposed portions are rubbed off by using a brush or the like while immersing the plate in a developer or jetting a developer in a shower fashion.

According to the developing method for a photosensitive resin printing plate material in which unexposed portions are rubbed off by using a brush or the like while immersing the plate in a developer or jetting a developer in a shower fashion, photosensitive resin layer components from the rubbed-off unexposed portions exist in a dissolved or dispersed state in the developer. If such a developer liquid is reused repeatedly to develop photosensitive resin printing plate materials, the concentration of photosensitive resin layer components in the developer increases, resulting in the problems of reduced developing speed, deposition of photosensitive resin layer components aggregated from the dispersed state on a printing plate or the brush of the developing machine, etc. Therefore, it is required that the developer be frequently replaced and the developer containing at least a certain level of photosensitive resin layer components be discarded as a waste liquid. Hence, the method suffers high costs of waste liquid disposal. Furthermore, due to large production of waste, the method also has problems in terms of environment protection.

Therefore, as a technique for reducing the environmental load, a closed-cycle method of reusing a developer used in the developing step is demanded. The closed-cycle methods proposed include, for example, a method in which dispersed photosensitive resin layer components are removed from a developer containing photosensitive resin layer components, a method in which aggregates are removed from a developer, for example, through the use of a filter or the like (Japanese Patent Application Laid-Open Publication No. 7-333861), a method in which photosensitive resin layer components in a developer are aggregated by adding a flocculating agent to the developer (Japanese Patent Application Laid-Open Publication No. 2001-47060), etc. However, the method in which photosensitive resin layer components are removed via a filter is not practical since the filter is soon clogged with photosensitive resin layer components. According to the method in which a flocculating agent is added, the flocculating agent is contained in the developer to be reused, thus resulting in the following problems. That is, the developing speed decreases, and photosensitive resin layer components produced during the development aggregate and deposit on a printing plate or the brush of the developing machine.

Thus, there is a need for a method for making a photosensitive resin printing plate in which a developer produced as a result of the step of developing a photosensitive resin printing plate material, more particularly, a developer produced as a result of the development of an aqueous-developable photosensitive resin printing plate material, is reused without a reduction in the developing speed nor aggregation of a photosensitive resin layer component, and also an apparatus for processing a developer produced as a result of the step of developing a photosensitive resin printing plate material.

SUMMARY

This disclosure relates to a method for making a photosensitive resin printing plate which comprises at least (1) the exposure step of forming a latent image in an aqueous-developable photosensitive resin layer of a printing plate material by irradiating the printing plate material with a ray of active light, (2) the development step of forming a relief image from the latent image by dissolving or dispersing the photosensitive resin layer that forms the latent image into a developer that contains water as a main component, and (3) the drying step of removing the developer from the printing plate having the relief image, the method being characterized in that a photosensitive resin layer component-dissolved or dispersed developer produced in the development step is subjected to a reduced pressure distillation, and is therefore reused as a developer, and that a residue produced by the reduced pressure distillation is solidified.

Furthermore, the disclosure relates to a photosensitive resin printing plate material developer processing apparatus for processing a photosensitive resin layer component-containing developer produced in a step of developing an aqueous-developable photosensitive resin printing plate material, the developer processing apparatus being characterized by comprising an evaporator that reduces a pressure of the developer, a cooler that recovers a developer by condensing a developer vapor, and a detachable inner container provided within the evaporator.

BRIEF DESCRIPTION OF THE DRAWINGS

FIGS. 3 to 5 are diagrams illustrating an example of a fly preventive device, wherein

Reference characters used in FIGS. 1 to 5 denote as follows.

1: evaporator
2: lid of the evaporator
3: vacuum gage
4: pressure release valve
5: vacuum unit
6: cooling tower
7: cooling water inlet
8: cooling water outlet
9: distilled liquid tank
10: distilled liquid delivery pump
11: float switch
12: developing machine
13: delivery pump
14: flow of the distilled liquid
15: flow of the photosensitive resin layer component-containing developer
16: resin bag
17: set ring
18: fly preventive device
18a: circular plate
18b: doughnut plate
18c: support rod
18d: hole
18e: outer cylinder
18f: inner cylinder
19: vapor recovery opening

DETAILED DESCRIPTION

First, a method for making a photosensitive resin printing plate will be described.

In order to form a relief image for printing through the use of a photosensitive resin printing plate, a negative or positive original image film is placed in close contact with a photosensitive resin layer from which a cover film has been peeled off, and the photosensitive resin layer is irradiated with ultraviolet light from a high-pressure mercury-vapor lamp, an ultra-high pressure mercury lamp, a metal hydride lamp, a xenon lamp, a carbon arc lamp, a chemical lamp, etc. which are capable of normally emitting light having a wavelength of 300 to 400 nm, so as to cause the hardening of photosensitive resin through photopolymerization and therefore form a latent image. Depending on the kinds of printing plates, a process of exposing a printing plate to light from the support side may be conducted prior to the formation of a latent image. Next, a relief image is formed on a substrate by a brush-type developing apparatus that removes unexposed portions of the photosensitive resin printing plate material by rubbing with a brush while immersing the photosensitive resin printing plate material in a developer whose main component is water, or while jetting such a developer to the photosensitive resin printing plate material in a shower fashion. Examples of the developer used in this process include water, aqueous solutions of surfactants, and aqueous solutions of other water-soluble compounds, etc. Photosensitive resin layer components from the rubbed-off unexposed portions mix into the developer, and exist in a dissolved or dispersed state. A preferable temperature of the developer during development ranges from 10° C. to 60° C. The printing plate carrying a relief image formed as described above is dried so as to remove the developer. A preferable drying temperature in this process ranges from 20° C. to 80° C. After that, an active light ray process is performed in the atmosphere or vacuum to obtain a printing plate.

In the invention, a developer having water as a main component in which the photosensitive resin layer components released during the development of the photosensitive resin printing plate in the above-described fashion are dissolved or dispersed is subjected to heating or pressure reduction, or both heating and pressure reduction, so as to vaporize the developer components. The produced vapor is condensed for recovery through the cooling accomplished by a cooling means, for example, a cooler through which cooling water or the like flows, or the like. The thus-recovered liquid is reused as a developer. The temperature of the developer during this process is preferably at least 30° C. in view of distillation efficiency. As for the pressure during this process, a pressure equal to or less than the vapor pressure is appropriate. A preferable pressure is at most 48 kPa, and a more preferable pressure is at most 13 kPa, in view of distillation efficiency. Solidification of post-distillation residue by a below-described solidification means eliminates the need for a subsequent process, such as filtration or the like, and thus facilitates the handling, and is therefore preferable. If the developer having water as a main component and also having photosensitive resin layer components in a dissolved or dispersed state contains a foaming component, for example, a surfactant or the like, it is appropriate to add an ordinary antifoam agent, and it is particularly effective to use a silicon-liquid antifoam agent.

In the case of reduced-pressure distillation of a developer containing photosensitive resin layer components, it is preferable to use a developer processing apparatus that is at least equipped with an evaporator that heats and depressurizes the developer, a cooler that has a means for cooling vapor from the developer, and a recovery unit that recovers a distilled developer. If a photosensitive resin layer component-containing developer is not directly placed in the evaporator but is placed in a container provided inside the evaporator (inner container), the photosensitive resin layer components concentrate within the inner container as the distillation progresses. If the inner container is configured for easy detachment, and is made of a material that is allowed to be disposed of, for example, a disposable resin, a disposable resin film or the like, the inner container can be disposed of together with the residue that contains concentrated photosensitive resin layer components, and therefore workability improves. Particularly, the use of a resin-made bag as an inner container is preferable due to good workability, for example, easy disposal, etc. If the developer is heated, it is appropriate to use, as an inner container, a heat-resistant bag, for example, a polyamide resin bag, a polypropylene resin bag, a high-density polyethylene resin bag, an aluminum foil-laminated bag of any one of the aforementioned resins, etc. If a small amount of the developer remains in the residue in the inner container, solidification of the developer together with the residue through the use of a water-absorbing compound or the like will improve workability. Examples of the water-absorbing compound include super absorbent resins, such as hydrocarbon polymers modified to be hydrophilic, vinyl alcohol/vinyl acetate copolymers, poly (meth)acrylic acid, polypeptides, polyacrylic acid salts, copolymers obtained from acrylic acid and maleic acid, itaconic acid, acryl amide, 2-hydroxyethyl methacrylate, etc. The amount of such a super absorbent resin varies depending on the kind of resin, the amount of residue, and the concentration rate of the residue. If the residue is about 5 to 15 kg, a practically preferable amount of the super absorbent resin is within the range of 10 g to 400 g.

Furthermore, the provision of a fly preventive device, such as an inner lid or the like, in the evaporator will prevent a photosensitive resin layer component from flying from the developer liquid and clogging a cooling pipeline, and is therefore effective. The configuration of the fly preventive device is not particularly restricted as long as the device is able to prevent a photosensitive resin layer component from flying to the cooling pipeline and allows condensation and recovery of evaporated developer. A structure that prevents the flow of vapor from moving straight to the cooler will curb the flying of photosensitive resin layer components to the cooling pipeline. Examples of the fly preventive device include (1) a fly preventive device in which a plurality of small pieces are arranged so as to cover the developer liquid surface and at least one of the small pieces has a height that is different from the height of other small pieces, (2) a fly preventive device which is formed by a plurality of closed-bottom cylindrical members that have a common upper bottom and in which a side surface of each closed-bottom cylindrical member has at least one hole, a fly preventive device having a combination of a device (1) and a device (2) provided above the device (1), etc.

Evaporated developer is cooled and condensed for recovery by the cooler. The cooler is not particularly restricted, but a known cooler may be used. Among the known coolers, a type of cooler in which cooling water flows is preferable for its simplicity.

The thus-condensed-and-recovered developer is substantially free of photosensitive resin layer components, and therefore can be repeatedly used as a developer. The developing machine employed at the time of reuse of the developer is not particularly restricted, but known photosensitive resin printing plate developing machines may be used. If a liquid-delivering pump for delivering a used developer that contains photosensitive resin layer components to the evaporator is provided, workability will improve.

A method for making photosensitive resin printing plate and a developer processing apparatus will be specifically described with reference to FIGS. 1 to 5.

Figure 1:
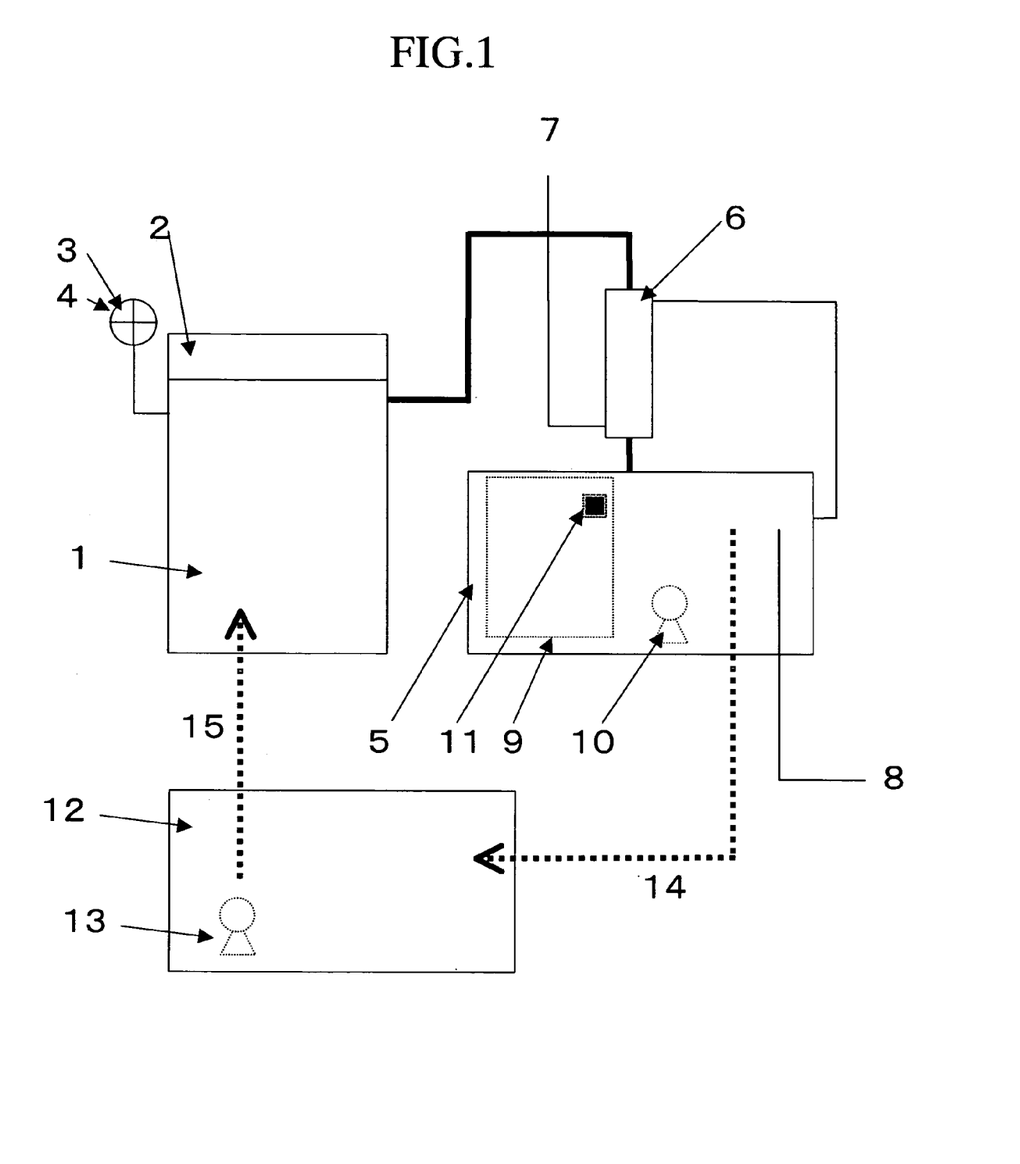
FIG. 1 is a diagram illustrating an example of developer processing apparatus.

FIG. 1 illustrates a specific example of a developer processing apparatus. A photosensitive resin layer component-containing developer produced from a developing machine 12 is placed into an evaporator 1. A flow 15 of the photosensitive resin layer component-containing developer is indicated by an arrow in FIG. 1. Workability will improve if a delivery pump 13 for delivering the distilled liquid from the developing machine 12 to the evaporator 1 is provided. The evaporator 1 has a heater for heating the spent developer. The pressure in the evaporator 1 is reduced by a vacuum unit 5. A vacuum gage 3 and a pressure release valve 4 are connected to the evaporator 1 for adjustment of the degree of vacuum (pressure) in the evaporator. The produced vapor is condensed by a cooling tower 6 that employs cooling water (that enters the cooling tower 6 via a cooling water inlet 7 and flows toward a cooling water outlet 8). The condensate is stored in a distilled liquid tank 9. Unattended operation becomes possible if the distilled liquid tank 9 is provided with a liquid level monitoring means, such as a float switch 11 or the like, and a design is made such that the processing of a necessary amount is automatically followed by an end of the process. If the distilled liquid is reused as a developer, provision of a distilled liquid delivery pump 10 for delivering the distilled liquid to the developing machine 12 will improve workability. A flow 14 of the distilled liquid is indicated by an arrow in FIG. 1. The distilled liquid is delivered to the developing machine 12, and can be used as a developer again. It is also possible to add fresh developer if the amount of distilled liquid does not reach the developer capacity of the developing machine. Subsequently, after development, the photosensitive resin layer component-containing developer produced during the developing step is put into the evaporator 1 for processing again. In this manner, the developer can be repeatedly used via the processing apparatus in accordance with the invention.

It is preferable that the photosensitive resin layer component-containing developer be subjected to the distillation process before the resin layer components have adverse effect on the development or the apparatus. The specific timing for the distillation process varies depending on the kinds of original printing plates. However, it is preferable to perform the distillation process if the amount of photosensitive resin layer components becomes 10% by weight or greater, more preferably, 5% by weight or greater. However, while the photosensitive resin layer components do not have adverse effect of the development or the apparatus, it is not necessary to perform the distillation process. Therefore, it is possible to neglect the amount of photosensitive resin layer components contained in the developer, and to simply perform development only during the daytime, and recover the developer through distillation during the nighttime, during which development is not performed, and reuse the developer on the following day.

If the distillation process is performed until the photosensitive resin layer components become dry and solid, the addition of a water-absorbing compound for disposal becomes unnecessary while other advantages are also achieved. However, in order to dry and solidify the photosensitive resin layer components, long-hour distillation and the like is needed. Therefore, in some cases, it is more advantageous in terms of cost to limit the distillation concentration of photosensitive resin layer components to a certain degree and add a water-absorbing compound for disposal. Specifically, it is preferable to concentrate the resin layer component (residue) to the range of 20 to 80% by weight through the distillation process, and add a water-absorbing compound for solidification and subsequent disposal.

Figure 2:
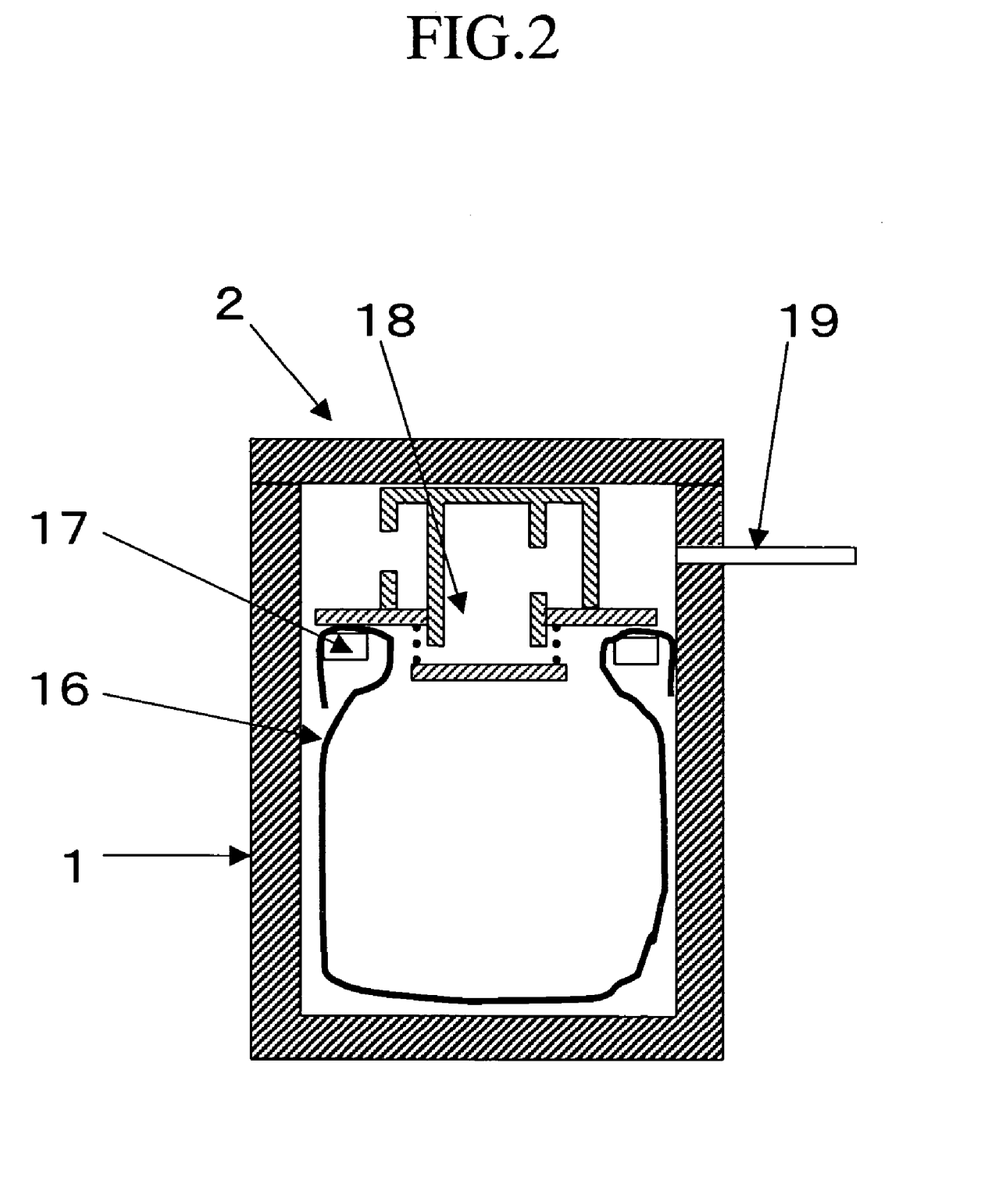
FIG. 2 is a longitudinal sectional view of an example of an evaporator.

FIG. 2 is a longitudinal sectional view of a specific example of the evaporator 1 shown in FIG. 1. The heating means, such as a heater or the like, and a pressure reduction pipeline are omitted from the illustration of FIG. 2. If the photosensitive resin layer component-containing developer is put into a resin bag (inner container) 16 that is fixed in the evaporator 1 via a set ring 17, the concentrated resin (residue) can be disposed of together with the resin bag 16 after process, and therefore workability will improve. In a case where the residue contains a small amount of a developer component, addition of a super absorbent polymer into the resin bag 16 solidifies the residue within the resin bag 16, and therefore particularly improves workability.

Furthermore, if a fly preventive device 18 is disposed above the set ring 17, resin flying during the distillation process can be prevented from clogging the vacuum pipeline via a vapor recovery opening 19. In FIG. 2, the fly preventive device 18 is constructed as follows. A fly preventive device (1) in which a circular plate and a doughnut-like plate whose central hole has a slightly smaller diameter than the circular plate are arranged at different levels is disposed above the developer liquid surface. Provided above the fly preventive device (1) is a fly preventive device (2) having a double-cylinder structure in which the two cylinders have a common upper bottom and each cylinder has a hole in its peripheral side surface. This fly preventive device 18 prevents a photosensitive resin layer component from flying out from the developer in the resin bag 16 and clogging the vapor recovery opening 19.

Figure 3:
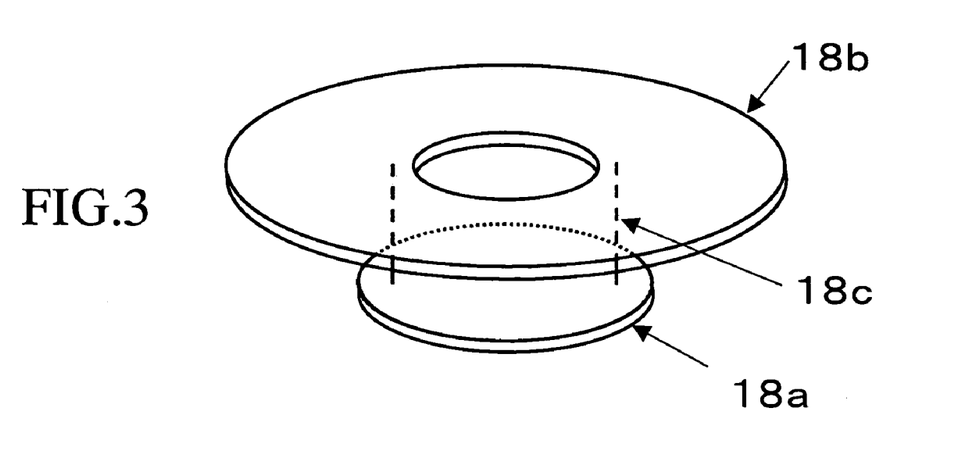
FIG. 3 is a perspective view of a fly preventive device (1)
Figure 4:
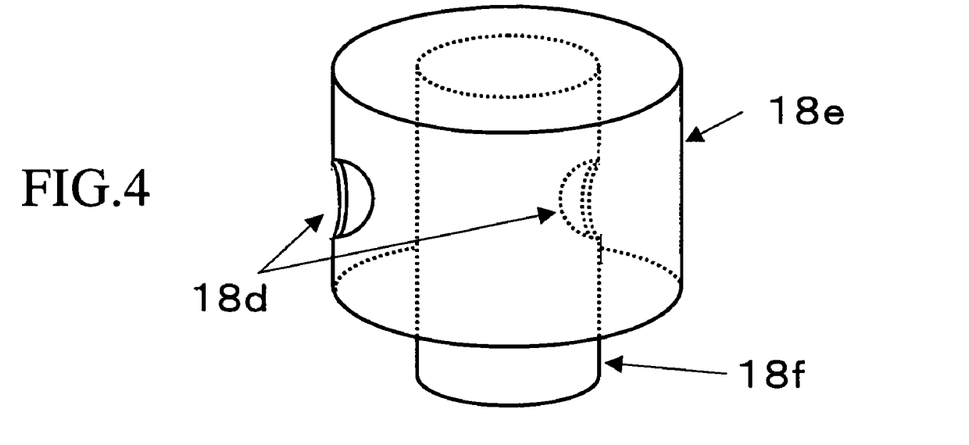
FIG. 4 is a perspective view of a fly preventive device (2)
Figure 5:
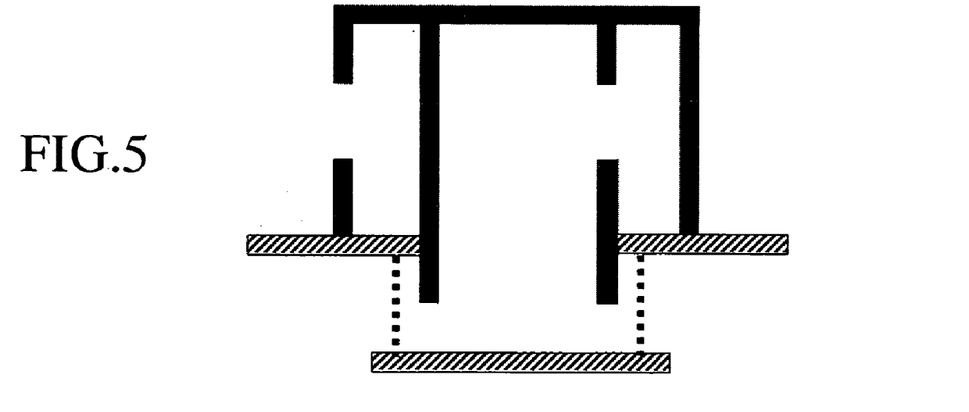
FIG. 5 is a longitudinal sectional view of the fly preventive devices (1) and (2) in a combined state.

Specific examples of the fly preventive device 18 are shown in FIGS. 3 to 5. The fly preventive devices shown in FIGS. 3 to 5 are suitable for an evaporator that has a circular cross-sectional shape. FIG. 3 shows a fly preventive device (1) employed in the example shown in FIG. 2. In the fly preventive device (1), a circular plate 18a and a doughnut-like plate 18b whose central hole has a slightly smaller diameter than the circular plate are arranged at different height levels with support rod 18c. FIG. 4 shows a fly preventive device (2) employed in the example shown in FIG. 2. The fly preventive device (2) has a double-cylinder configuration formed by two cylinders that have a common upper bottom and each cylinder has a hole 18d in its peripheral side surface. A plurality of holes may also be formed in the peripheral side surface of each cylinder. It is preferable that the holes in the outer and inner cylinder peripherals be not coaxial with each other. In FIG. 4, the holes are 180°-opposite to each other. It is preferable that the length of an outer cylinder 18e of the fly preventive device (2) be equal to the height difference between the doughnut-like plate of the fly preventive device (1) and a lid 2 of the evaporator. It is preferable that the length of an inner cylinder 18f of the fly preventive device (2) be greater than that of the outer cylinder 18e, and be such a length that the inner cylinder 18f is within a space between the circular plate of the fly preventive device (1) and the lid 2 of the evaporator. A combination of the fly preventive device (2) and the fly preventive device (1) is shown in a longitudinal sectional view in FIG. 5. The material of the fly preventive device 18 is not particularly limited, but is preferably stainless steel, a plated stainless steel, or a fluorine-coated stainless steel.

A particularly preferable photosensitive resin printing plate material in the invention, among known photosensitive resin printing plate materials that form a latent image when irradiated with rays of active light, is a photosensitive resin printing plate material having an aqueous development property in view of working atmosphere and local environment. Examples of the photosensitive resin printing plate material having an aqueous development property include a letterpress-purpose plate material, a flexographic printing-purpose plate material, etc. An aqueous-developable photosensitive resin printing plate material suitable for use as a photosensitive resin printing plate material in the invention will be presented below.

Examples of the polymer component of a letterpress printing plate material suitable for use in the invention include water-soluble or water-swelling polyamides obtained by introducing a hydrophilic component into polyamide, partially saponified polyvinyl acetates, derivatives thereof, etc.

The water-soluble or water-swelling polyamide refers to a polyamide that completely dissolves or completely disperses in water by immersion in water at 25° C. for 24 hours. Among such polyamides, a mixed polyamide containing 30 to 70% by weight of a constitution unit formed by: (A) polyoxyethylene in which an amino group or a carboxyl group is present at a terminal and the number average molecular weight of a polyether segment portion is 150 to 1500, and (B) aliphatic dicarboxylic acid or diamine is preferable because the use thereof brings advantages of the invention to the fore. Specific examples of the component (A) include polyoxyethylenediamine and polyoxyethylene dicarboxylic acid. It is preferable that the number average molecular weight of a polyether segment portion in (A) be 150 to 1500. Examples of the component (B) include mixed polyamides that contains, as a main constitution unit, a unit derived from aliphatic dicarboxylic acids, such as oxalic acid, succinic acid, glutaric acid, adipic acid, pimelic acid, suberic acid, azelaic acid, sebacic acid, undecanedionic acid, dodecanedionic acid, diglycolic acid, etc., or aliphatic diamines, such as ethylenediamine, trimethylenediamine, tetramethylenediamine, hexamethylenediamine, undecamethylenediamine, dodecamethylenediamine, 2,2,4- and 2,4,4-trimethylhexamethylenediamine, etc. It is preferable that the amount of the constitution unit formed by the components (A) and (B) contained in the mixed polyamide be within the range of 30 to 70% by weight.

An amido group-forming copolymerization component to be copolymerized with the constitution unit formed by the components (A) and (B) is not particularly limited, but may be a known component, for example, a component selected from salts and the like derived from $\epsilon$-caprolactam, $\omega$-laurolactam, lactams of 6-aminocaproic acid, 11-aminoundecanoic acid, 12-amiododecanoic acid, etc., and amino acids as well as combinations of the aforementioned aliphatic, alicyclic and aromatic diamines and dicarboxylic acids.

As for the partially saponified polyvinyl acetate for use, a preferable degree of saponification is 60 to 99 mol %, and a more preferable degree of saponification is 70 to 90 mol %. With regard to the degree of polymerization thereof, the average degree of polymerization is preferably 300 to 2000 and, more preferably, 500 to 1700. This range of degree of polymerization will achieve both good development property and good relief toughness of the photosensitive resin composition.

In the case of a polymer obtained from a partially saponified polyvinyl acetate by introducing —O—$CH_2$—$CH_2$— bonds to side chains thereof, a polymer obtained by copolymerizing a partially saponified polyvinyl acetate with at most 20 mol % of allylsulfonic acid or the like, or a partially saponified polyvinyl acetate obtained by introducing unsaturated bonds to side chains or terminals of the polymer through reaction of the polymer with unsaturated carboxylic acid, unsaturated aldehyde, N-methylolacrylamide, unsaturated epoxy or the like, it is preferable that the degree of saponification calculated from the number of hydroxyl groups remaining in the polymer be within the range of 60 to 99 mol %.

The aforementioned polymers may be mixed for use. Furthermore, the aforementioned polymers may be mixed with other kinds of polymers for use. Examples of the polymers to be mixed include polymers that are normally used in photosensitive resin compositions, such as general-purpose rubbers, including butadiene rubber, nitrile rubber, urethane rubber, isoprene rubber, styrene-butadiene rubber, styrene-isoprene rubber, etc., as well as elastomer, cellulose derivatives, polyester resin, silicone rubber, acrylic resin, polyurethane rein, epoxy resin, polystyrene, polypropylene, polyethylene, chlorinated polyethylene, polyvinyl chloride, etc.

As for the ethylene-based unsaturated compound, generally known compounds may be used. Specific examples thereof include, but are not limited to, the following compounds.

That is, examples thereof include compounds that have only one ethylene-based unsaturated bond, including (meth)acrylates having hydroxyl groups, such as 2-hydroxyethyl (meth)acrylate, 2-hydroxypropyl (meth)acrylate, 2-hydroxybutyl (meth)acrylate, 3-chloro-2-hydroxypropyl (meth)acrylate, β-hydroxy-β'-(meth)acryloyl oxyethylphthalate, etc., alkyl (meth)acrylates, such as methyl (meth)acrylate, ethyl (meth)acrylate, propyl (meth)acrylate, butyl (meth)acrylate, isoamyl (meth)acrylate, 2-etylhexyl (meth)acrylate, lauryl (meth)acrylate, stearyl (meth)acrylate, etc., cycloalkylaryl (meth)acrylates, such as cyclohexyl (meth)acrylate, etc., halogenated alkyl (meth)acrylates, such as chloroethyl (meth)acrylate, chloropropyl (meth)acrylate, etc., alkoxyalkyl (meth)acrylates, such as methoxyethyl (meth)acrylate, ethoxyethyl (meth)acrylate, butoxyethyl (meth)acrylate, etc., phenoxyalkyl (meth)acrylates, such as phenoxyehtyl acrylate, nonylphenoxyethyl (meth)acrylate, etc., alkoxyalkylene glycol (meth)acrylates, such as ethoxydiethylene glycol (meth)acrylate, methoxytriethylene glycol (meth)acrylate, methoxydiprppylene glycol (meth)acrylate, etc., (meth)acrylamides, such as (meth)acrylamide, diacetone (meth)acrylamide, N,N'-methylenebis(meth)acrylamide, as well as 2,2-dimethylaminoethyl (meth)acrylate, 2,2-diehtylaminoethyl (meth)acrylate, N,N-dimethylaminoethyl (meth)acrylamide, N,N-dimethylaminopropyl (meth) acrylamide, 2-hydoxyethyl (meth)acrylate, 3-chrolo-2-hydroxypropyl (meth)acrylate, etc., and compounds having two or more ethylene-based unsaturated bonds, including di(meth)acrylates of polyethylene glycols, such as dietylene glycol di(meth)acrylate, etc., polypropylene glycol di(meth) acrylates, such as dipropylene glycol di(meth)acrylate, etc., as well as trimethylolpropane tri(meth)acrylate, pentaerythritol tri(meth)acrylate, pentaerythritol tetra(meth)acrylate, glycerol tri(meth)acrylate, multi(meth)acrylate obtained via addition reaction of ethylene glycol diglycidyl ether with a compound having an active hydrogen and an ethylene-based unsaturated bond, such as unsaturated carboxylic acid, unsaturated alcohol, etc., multi(meth)acrylate obtained via addition reaction of an unsaturated epoxy compound, such as glycidyl (meth)acrylate or the like, and a compound having an active hydrogen, such as carboxylic acid, amine or the like, multi(meth)acrylamides, such as methylenebis (meth)acrylamide, etc., multi-vinyl compounds, such as divinylbenzene, etc.

Generally, a photopolymerization initiator is added to the photosensitive resin composition. Any photopolymerization initiator may be used as long as it is able to polymerize polymerizable carbon-carbon unsaturated groups upon light irradiation. Among the photopolymerization initiators, initiators that perform the function of generating radicals due to self-decomposition or hydrogen extraction upon absorbing light are preferably used. Examples thereof include benzoin alkyl ethers, benzophenones, anthraquinones, benzyls, acetophenones, diacetyls, etc.

It is also possible to add, to the photosensitive resin composition, a polyhydric alcohol, such as ethylene glycol, diethylene glycol, triethylene glycol, glycerin, trimethylol propane, trimethylol ethane, etc., or a liquid rubber, such as liquid polybutadiene, liquid polyisoprene, etc., as auxiliary compatibilizer for increasing the compatibility and flexibility.

In order to increase the thermal stability of the photosensitive resin composition, a known polymerization inhibitor may be added. Examples of preferable polymerization inhibitors include phenols, hydroquinones, catechols, etc.

Dye, pigment, surfactant, ultraviolet absorber, aromatic, etc., may be added as other components.

Examples of the flexographic printing-purpose printing material preferably used in the invention include a flexographic printing-purpose printing material having a photosensitive layer in which synthetic rubbers such as a carboxylated nitrile rubber, a non-carboxylated nitrile rubber, butadiene rubber, etc., water-dispersed latex, and hydrophilic monomers form sea and island structure described in Japanese Patent Application Laid-Open Publication No. 2000-155417.

The photosensitive resin printing plate containing a photosensitive resin composition that includes the aforementioned components in a photosensitive layer is produced in the following manner. After a polymer component is dissolved in a water/alcohol mixture solvent by heating, an ethylene-based unsaturated compound, a photopolymerization initiator, a photosensitizer, a heat polymerization inhibitor, etc., are added thereto, and are thoroughly mixed by stirring. Thus, a photosensitive resin composition solution is obtained. After the solvent is removed from the solution by distillation, a photosensitive layer is formed on a substrate with an adhesive applied thereon, by melt extrusion. A photosensitive layer may also be formed by flow-casting and drying a melt mixture of a polymer, an ethylene-based unsaturated compound, a photopolymerization initiator, a photosensitizer, a heat polymerization inhibitor, etc., and water or alcohol or a water/alcohol mixture solvent, on a substrate with an adhesive applied thereon. A cover film with an anti-tack agent applied thereon is closely attached to the photosensitive layer, so that a photosensitive resin plate material for a printing plate is obtained. A photosensitive resin plate material for a printing plate may also be formed by forming a photosensitive resin sheet by a dry film forming process, and sandwiching the photosensitive resin sheet between the substrate and the cover film. As the substrate, sheets of metal, such as steel, stainless steel, aluminum, etc., sheets of plastic, such as polyester or the like, sheets of synthetic rubber, such as styrene-dibutadiene rubber or the like, may be used.

Selected aspects of the invention will be described below with reference to examples, but is not restricted by the examples.

(Preparation of Photosensitive Flexographic Printing-Purpose Plate)

43.6 parts by weight (22 parts by weight in solid) of "Laxter" DM811 (by Dainippon Ink and Chemicals, Incorporated, carboxy modified butadiene latex, 50.5% in solid concentration), 14.5 parts by weight (8 parts by weigh) of "Nipol" LX111NF (by Nippon Zeon Corporation, butadiene latex, 55% in solid concentration), 9 parts by weight "Light Acrylate" P400A (by Kyoeisha Chemical Co., Ltd., phenoxy polyethylene glycol acrylate), and 11 parts by weight of "Epoxy Ester" 80MFSA (by Kyoeisha Chemical Co., Ltd., a condensation polymer of glycerin polyether polyol, succinic anhydride and 2-hydroxyethyl acrylate) were mixed, and were dried for six hours by a dryer heated at 120° C. to vaporize water content. Thus, a water-dispersed latex/hydrophilic monomer mixture-1 was obtained.

Next, after components (a) to (d) presented below were kneaded for 5 minutes by a Labo Kneader Mill (by Toshin) heated at 150° C., components (e) to (i) were put in, and the mixture was further kneaded for 10 minutes at 120° C. After that, components (j) to (l) were added, and the mixture was kneaded for 5 minutes. Thus, a photosensitive resin composition was obtained.

(a) polyamide resin (polyamide copolymer of ε-caprolactam/equimolar salt of hexamethylenediamine and adipic acid/equimolar salt of α-diaminopropyl polyoxyehtylene (1000 in number average molecular weight) and adipic acid=20/20/60 (weight ratio)):
2 parts by weight
(b) non-carboxylated nitrile rubber ("Nipol" DN407 by Nippon Zeon Corporation)
11 parts by weight
(c) carboxylated nitrile rubber ("Nipol" 1072 by Nippon Zeon Corporation)
4 parts by weight
(d) butadiene rubber ("Nipol" 1220L by Nippon Zeon Corporation)
18 parts by weight
(e) rubber processing aid ("Plastrozin" J by Fujisawa Pharmaceutical Co., Ltd.)
2 parts by weight
(f) copolymer of ethylene glycol and propylene glycol ("Pronon" 204 by NOF Corporation)
0.5 part by weight
(g) stearyl acrylate
2 parts by weight
(h) water-dispersed latex/hydrophilic monomer mixture-1
50 parts by weight
(i) diesterification product of bisphenol and triethylene glycol methacrylate ("Light Ester" BP-6EM by Kyoeisha Chemical Co., Ltd.)
8 parts by weight
(j) dimethylbenzyl ketal
0.8 part by weight
(k) ultraviolet absorber ("Tinuvin" 327 by Ciba Specialty Chemicals K.K.)
0.2 part by weight
(l) hydroquinone monomethyl ether
0.1 part by weight The thus-obtained photosensitive resin composition is sandwiched between a substrate prepared by applying adhesive to a polyethylene terephthalate film of 125 μm and a cover film having an anti-tack layer. Then, pressing was performed by a press machine heated at 110° C., in such a manner that the thickness of the photosensitive resin layer became 1.5 mm. Thus, a photosensitive flexographic printing-purpose plate material was obtained.

EXAMPLE 1

A sensitivity measuring gray scale negative film and an image reproducibility evaluating negative film (3% half tone of 133 LPI (lines per inch), isolated dots of 200 μm) were vacuum-attached to a photosensitive resin printing plate material "Torelief" WF95DII (by Toray Industries, Inc.). Then, exposure was carried out for 2 minutes by an ultrahigh pressure mercury lamp exposure machine. Then, using a 50-liter-capacity brush-type developing machine "FTP460II" (by Fuji Photo Film Co., Ltd.), 25 plates of A3 size were subjected to development in a neutral water having a temperature of 25° C., that is, a developer, drying and post-exposure. Thus, photosensitive resin printing plates were obtained. A spent developer with the resin layer component concentration being about 5% by weight was obtained from the brush-type developing machine "FTP460II".

The developer was put into a polypropylene resin bag within an evaporator shown in FIG. 2, and a fly preventive device (fly preventive devices (1) and (2) shown in FIGS. 3 and 4) was set. Then, using the processing apparatus shown in FIG. 1, distillation was performed in the conditions of 85° C. in the developer temperature and 4 kPa in the vacuum pressure. Tap water was caused to flow through the condenser as cooling water at a rate of 10 liter per minute. As a result, 45 liter of developer was recovered in 10 hours. After the process, 5 kg of residue containing a small amount of developer which remained in the resin bag was solidified by adding thereto 150 g of super absorbent polymer "Aqua Keep" 10SH-P (by Sumitomo Seika Chemicals Co., Ltd.), and the solidified residue, together with the resin bag, was discarded as a plastic waste.

The liquid recovered through condensation was reused as a developer, with 5 liter of neutral water added, to develop 25 plates of A3 size in the above-described manner. The reused developer in the developing machine was visually observed. It was found that the developer was a whitish liquid, and that there was no deposit or the like on the developing machine or the developing brush. Evaluation of the obtained relief images revealed that the gray scale had 17 steps, and the 200 μm isolated dots and the 3% half tone in the image portion were reproduced.

After 40 cycles of similar development (25 plates of A3 size) and distillation (45 liter recovered, and 5 liter added), the reused developer resent in the developing machine was visually observed. It was ascertained that the developer was a whitish liquid, and that there was no deposit or the like on the developing machine or the developing brush. Evaluation of the obtained relief images revealed that the gray scale had 17 steps, and the 200 μm isolated dots and the 3% half tone in the image portion were reproduced.

EXAMPLE 2

A photosensitive flexographic printing-purpose plate material was exposed from the support side for 2 minutes by using "FTW350LII" (by Fuji Photo Film Co., Ltd.) with six of "TL" K40W/10R (chemical lamps by Phillips) installed. After the cover film was peeled off, an image reproducibility evaluating negative film (having 3% half tone of 133 LPI, and 200 μm isolated dots) was vacuum-attached onto the photosensitive resin layer. Exposure was then performed for 10 minutes. Edge portions of each plate material were covered with light-blocking film, thereby preventing irradiation of the edge portions.

Then, using a flexographic developing machine "Jem-Flex" JOW-A2-WFD (by Nippon Denshi Seiki K.K.), 20 plates of A3 size were subjected to development, non-crosslinked portions of the photosensitive resin layer were rubbed off, for 6 minutes by using, as a developer, a neutral water containing 0.5% by weight of Nissan Powder Soap(by Nissan Sekken K.K.) and having a temperature of 60° C. So a photosensitive flexographic printing plate had a relief image. 50 liter of developer with the photosensitive resin layer component concentration being about 5% by weight was obtained from the brush-type developing machine.

After "AF" (by Fuji Photo Film Co., Ltd.) was added as an anti-foam agent, a reduced-pressure distillation process was conducted as in Example 1. As a result, 45 liter of developer was recovered in 10 hours. After the process, residue containing small amount of developer which remained in the resin bag was solidified by adding thereto 150 g of super absorbent polymer "Aqua Keep" 10SH-P (by Sumitomo Seika Chemicals Co., Ltd.), and the solidified residue, together with the resin bag, was discarded as a plastic waste.

The liquid recovered through condensation was reused as a developer, with 5 liter of neutral water and 0.5% by weight of Nissan Powder Soap added, to develop 20 plates of A3 size in the above-described manner. After that, it was ascertained that the developing machine and the developing brush were free of deposit or the like.

COMPARATIVE EXAMPLE 1

Using the developer with the resin composition concentration being about 5% by weight which was obtained as in Example 1, 50 plates of A3 size were subjected to development in substantially the same manner as described above. Subsequent observation revealed that the developer had aggregation of photosensitive resin layer components, and that the developing brush had deposition of a large amount of tacky aggregate. Evaluation of the obtained relief images revealed that plate surfaces had deposition of aggregates of photosensitive resin layer components.

COMPARATIVE EXAMPLE 2

The developer with the resin composition concentration being about 5% by weight which was obtained as in Example 1 was heated at 40° C. for 2 hours via a developer processing machine "FTR80II" (by Fuji Photo Film Co., Ltd.) to aggregate photosensitive resin layer components. After that, the developer was filtered via a nonwoven fabric "Axter" G5075 (by Toray Industries, Inc.) having a weight of 75 g/m$^2$, an air permeation of 145 cm$^3$/cm$^2$/sec., and a fiber diameter of 24 μm. At the time of recovery of 10 liter of developer, the filtration discontinued due to the clogging of the nonwoven fabric.

INDUSTRIAL APPLICABILITY

The present invention provides a method for making a photosensitive resin printing plate in which a developer produced as a result of the step of developing a photosensitive resin printing plate material, more particularly, a developer produced as a result of the development of an aqueous-developable photosensitive resin printing plate material, is reused without a reduction in the developing speed nor aggregation of a photosensitive resin layer component, and also provides an apparatus for processing a developer produced as a result of the step of developing a photosensitive resin printing plate material.

According to the invention, in relation to the development of a photosensitive resin printing plate material, the developer is recovered through heating, or pressure reduction, or both heating and pressure reduction, and subsequent condensation, whereby photosensitive resin composition is removed from the developer. Thus, the developer can be reused.

The invention claimed is:

1. A method for making a photosensitive resin printing plate which comprises at least (1) an exposure step of forming a latent image in an aqueous-developable photosensitive resin layer of a printing plate material by irradiating the printing plate material with a ray of active light, (2) a development step of forming a relief image from the latent image by dissolving or dispersing the photosensitive resin layer that forms the latent image into a developer that contains water as a main component, and (3) a drying step of removing the developer from the printing plate having the relief image, wherein a photosensitive layer component-dissolved or dispersed in developer produced in the development step is subjected to reduced pressure distillation via a developer processing apparatus having at least a detachable inner container and a developer fly preventive device, and reused as a developer.

2. The method according to claim 1, wherein the printing plate material having the aqueous-developable photosensitive resin layer is a letterpress-purpose plate material or a flexographic printing-purpose plate material.

3. The method according to claim 1, wherein, in the reduced pressure distillation, an air pressure is set equal to or lower than 13 kPa and a developer temperature is set equal to or higher than 30° C.

4. The method according to claim 1, wherein residue produced by the reduced pressure distillation is solidified within a detachable inner container by using a water-absorbing compound.

5. The method according to claim 1, wherein said developer processing apparatus further comprises an evaporator that reduces a pressure of the developer and a cooler that recovers the developer by condensing developer vapor, and wherein said detachable inner container is provided within the evaporator.

6. The method according to claim 5, wherein a vapor recovery opening portion and a developer fly preventive device are provided above said detachable inner container, within the evaporator.

7. The method according to claim 1, wherein said detachable inner container is a resin bag.

* * * * *